United States Patent
Liu et al.

(10) Patent No.: US 12,137,603 B2
(45) Date of Patent: *Nov. 5, 2024

(54) FLEXIBLE DISPLAY MODULE AND DISPLAY DEVICE

(71) Applicant: BOE TECHNOLOGY GROUP CO., LTD., Beijing (CN)

(72) Inventors: Lu Liu, Beijing (CN); Shan-Chen Kao, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/454,096

(22) Filed: Aug. 23, 2023

(65) Prior Publication Data
US 2023/0397480 A1  Dec. 7, 2023

Related U.S. Application Data

(63) Continuation of application No. 17/575,400, filed on Jan. 13, 2022, now Pat. No. 11,785,834, which is a (Continued)

(30) Foreign Application Priority Data

Dec. 9, 2016 (CN) .......................... 201611132175.3

(51) Int. Cl.
*B32B 7/02* (2019.01)
*G06F 1/16* (2006.01)
(Continued)

(52) U.S. Cl.
CPC .......... *H10K 77/111* (2023.02); *G06F 1/1652* (2013.01); *G09F 9/301* (2013.01); *G09G 3/035* (2020.08); *H10K 2102/311* (2023.02)

(58) Field of Classification Search
CPC . B32B 17/06; B32B 2307/51; B32B 2307/54; B32B 2307/732;
(Continued)

(56) References Cited

U.S. PATENT DOCUMENTS 9,029,846 B2   5/2015 Song et al.
10,608,200 B2 * 3/2020 Liu .......................... G09F 9/301
(Continued)

FOREIGN PATENT DOCUMENTS

AU   2015355047 A1   6/2017
CN   104241316 A   12/2014
(Continued)

OTHER PUBLICATIONS

Notice of Allowance from U.S. Appl. No. 17/575,400 dated Jun. 9, 2023.
(Continued)

*Primary Examiner* — Lawrence D Ferguson
(74) *Attorney, Agent, or Firm* — Calfee, Halter & Griswold LLP

(57) ABSTRACT

A flexible display module and a display device are provided. The flexible display module includes: a flexible substrate; a display layer, disposed on the flexible substrate; a reinforcement layer, disposed on a side of the display layer distal to the flexible substrate; a protective layer, disposed on a side of the reinforcement layer distal to the flexible substrate; a polarizing layer, disposed between the display layer and the reinforcement layer; a touch layer, disposed between the polarizing layer and the display layer; and a base film, disposed on a back surface of the flexible substrate; wherein material of the reinforcement layer comprises glass and a thickness of the reinforcement layer ranges from 10 μm to 150 μm.

20 Claims, 14 Drawing Sheets

Related U.S. Application Data continuation-in-part of application No. 16/799,889, filed on Feb. 25, 2020, now Pat. No. 11,258,043, which is a continuation-in-part of application No. 15/580,349, filed as application No. PCT/CN2017/089360 on Jun. 21, 2017, now Pat. No. 10,608,200.

(51) Int. Cl.
*G09F 9/30* (2006.01)
*H10K 77/10* (2023.01)
*G09G 3/00* (2006.01)
*H10K 102/00* (2023.01)

(58) Field of Classification Search
CPC ........ B32B 2457/206; B32B 2457/208; B32B 27/08; B32B 27/281; B32B 7/12; G06F 1/1652; G06F 2203/04102; G06F 3/041; G09F 9/301; G09G 3/035; G09G 3/3208; H10K 2102/311; H10K 59/40; H10K 59/87; H10K 59/8791; H10K 77/111; Y02E 10/549
See application file for complete search history.

(56) References Cited

U.S. PATENT DOCUMENTS

| | | | |
|---|---|---|---|
| 11,785,834 B2 * | 10/2023 | Liu | G06F 1/1652 361/679.56 |
| 2014/0367644 A1 | 12/2014 | Song et al. | |
| 2015/0337100 A1 | 11/2015 | Woo et al. | |
| 2016/0155967 A1 * | 6/2016 | Lee | H10K 59/40 257/88 |

FOREIGN PATENT DOCUMENTS

| | | |
|---|---|---|
| CN | 105977277 A | 9/2016 |
| CN | 106155399 A | 11/2016 |
| CN | 106710449 A | 5/2017 |
| TW | M512744 U | 11/2015 |
| TW | I553529 B | 10/2016 |
| TW | 201638745 A | 11/2016 |
| WO | 2016/085182 A1 | 6/2016 |

OTHER PUBLICATIONS

Office action from U.S. Appl. No. 17/575,400 dated Mar. 14, 2023.
Office action from U.S. Appl. No. 17/575,400 dated Dec. 2, 2022.
Office action from U.S. Appl. No. 16/799,889 dated Jul. 9, 2021.
Notice of Allowance from U.S. Appl. No. 16/799,889 dated Oct. 14, 2021.
Notice of Allowance from U.S. Appl. No. 15/580,349 dated Nov. 22, 2019.
Office action from U.S. Appl. No. 15/580,349 dated Aug. 20, 2019.
Written Opinion from PCT/CN2017/089360 dated Aug. 24, 2017.
International Search Report from PCT/CN2017/089360 dated Aug. 24, 2017.
Office action from Chinese Application No. 201611132175.3 dated Oct. 31, 2018.
Office action from Chinese Application No. 201611132175.3 dated Jul. 9, 2019.
Office action from Chinese Application No. 201611132175.3 dated Feb. 26, 2019.
Office action from Chinese Application No. 201611132175.3 dated Oct. 9, 2017.
Office action from Chinese Application No. 201611132175.3 dated Jun. 4, 2018.

* cited by examiner

| Protective layer | — 300 |
| --- | --- |
| Touch layer | — 600 |
| Polarizing layer | — 500 |
| Strengthening layer | — 400 |
| Display layer | — 200 |
| Flexible substrate | — 100 |
| Base film and other protective layers | — 700 |

Fig. 3C

| Protective layer | — 300 |
| --- | --- |
| Reinforcement layer | — 400 |
| Polarizing layer | — 500 |
| Touch layer | — 600 |
| Display layer | — 200 |
| Flexible substrate | — 100 |
| Base film and other protective layers | — 700 |

Fig. 3D

| Protective layer | — 1300 |
| Reinforcement layer | — 1400 |
| Polarizing layer | — 1500 |
| Touch layer | — 1600 |
| Display layer | — 1200 |
| Pressure sensitive adhesive layer | — 1701 |
| polyimide layer | — 1702 |
| Third optical clear adhesive layer | — 1800 |
| Flexible substrate | — 1100 |

Fig. 5C

FLEXIBLE DISPLAY MODULE AND DISPLAY DEVICE

CROSS REFERENCE

This application is a Continuation of U.S. application Ser. No. 17/575,400, filed on Jan. 13, 2022, which is a Continuation-in-Part application of U.S. patent application Ser. No. 16/799,889, filed on Feb. 25, 2020, now U.S. Pat. No. 11,258,043, which is a Continuation-in-Part application of U.S. patent application Ser. No. 15/580,349 filed on Dec. 7, 2017, now U.S. Pat. No. 10,608,200, which is based on International Application No. PCT/CN2017/089360, filed on Jun. 21, 2017, which is based upon and claims priority to Chinese Patent Application No. 201611132175.3 filed on Dec. 9, 2016, titled "FLEXIBLE DISPLAY MODULE AND DISPLAY DEVICE", and the entire contents thereof are incorporated herein by reference.

TECHNICAL FIELD

The present disclosure relates to the field of flexible display technology, and more particularly, to a flexible display module and a display device.

BACKGROUND

The present flexible display module consists of a multi-layer film structure, and a general flexible display module includes, arranged sequentially on a flexible substrate, a display layer (including an OLED display device and a pixel circuit), a circularly polarized light layer (C-POL), a touch layer, a protective layer, and a base film disposed on the back of the flexible substrate, etc. Among them, the protective layer plays a role in protecting the overall flexible display module.

In order to meet the bending characteristics of the flexible display module, there is a limit to the thickness of the flexible protective layer of the flexible display module, thereby affecting the protective properties of the protective layer to the underlying OLED device. In the ball drop test, although the protective layer is not damaged, the OLED device in the flexible display module may have failures which show up as extremely large black spots. As the thickness of the protective layer increases, the protection characteristics of the OLED device will be improved, but the bending characteristics of the flexible display module are affected.

Therefore, how to enhance the reliability of the flexible display module while maintaining the bending characteristics of the flexible display module is a technical problem that needs to be solved in the field.

It should be noted that, information disclosed in the above background portion is provided only for better understanding of the background of the present disclosure, and thus it may contain information that does not form the prior art known by those ordinary skilled in the art.

SUMMARY

The embodiments of the present disclosure provide a flexible display module and a display device.

The embodiments of the present disclosure provide a flexible display module, including: a flexible substrate; a display layer, disposed on the flexible substrate; a reinforcement layer, disposed on a side of the display layer distal to the flexible substrate; a protective layer, disposed on a side of the reinforcement layer distal to the flexible substrate; a polarizing layer, disposed between the display layer and the reinforcement layer; a touch layer, disposed between the polarizing layer and the display layer; and a base film, disposed on a back surface of the flexible substrate; wherein material of the reinforcement layer includes glass and a thickness of the reinforcement layer ranges from 10 μm to 150 μm.

In one possible embodiment, the thickness of the reinforcement layer ranges from 30 μm to 120 μm.

In one possible embodiment, the thickness of the reinforcement layer ranges from 30 μm to 100 μm.

In one possible embodiment, modulus of the reinforcement layer ranges from 10 Gpa to 200 Gpa.

In one possible embodiment, material of the protective layer is a plastic substrate.

In one possible embodiment, a thickness of the protective layer ranges from 5 μm to 300 μm.

In one possible embodiment, the polarizing layer is a circular polarizing layer.

In one possible embodiment, transmittance of the reinforcement layer is greater than 90%.

In one possible embodiment, the reinforcement layer is a laminated layer of the glass and an organic material layer.

In one possible embodiment, the organic material layer is disposed above or below the glass.

In one possible embodiment, the organic material layer is polyethylene terephthalate, or polyimide.

The embodiments of the present disclosure provide a display device including a flexible display module, wherein the flexible display module includes: a flexible substrate; a display layer, disposed on the flexible substrate; a reinforcement layer, disposed on a side of the display layer distal to the flexible substrate; a protective layer, disposed on a side of the reinforcement layer distal to the flexible substrate; a polarizing layer, disposed between the display layer and the reinforcement layer; a touch layer, disposed between the polarizing layer and the display layer; and a base film, disposed on a back surface of the flexible substrate; wherein material of the reinforcement layer includes glass and a thickness of the reinforcement layer ranges from 10 μm to 150 μm.

In one possible embodiment, the thickness of the reinforcement layer ranges from 30 μm to 120 μm.

In one possible embodiment, the thickness of the reinforcement layer ranges from 30 μm to 100 μm.

In one possible embodiment, modulus of the reinforcement layer ranges from 10 Gpa to 200 Gpa.

In one possible embodiment, material of the protective layer is a plastic substrate.

In one possible embodiment, a thickness of the protective layer ranges from 5 μm to 300 μm.

In one possible embodiment, the polarizing layer is a circular polarizing layer.

In one possible embodiment, transmittance of the reinforcement layer is greater than 90%.

The embodiments of the present disclosure provide a display device including a flexible display module, wherein the flexible display module includes: a flexible substrate; a display layer, disposed on the flexible substrate; a reinforcement layer, disposed on a side of the display layer distal to the flexible substrate; a protective layer, disposed on a side of the reinforcement layer distal to the flexible substrate; wherein material of the protective layer is a plastic substrate; a polarizing layer, disposed between the display layer and the reinforcement layer; a touch layer, disposed between the polarizing layer and the display layer; and a base film, disposed on a back surface of the flexible substrate; wherein material of the reinforcement layer comprises glass and a thickness of the reinforcement layer is 30 μm.

BRIEF DESCRIPTION OF THE DRAWINGS

FIGS. 3A to 3F are yet another structural schematic diagrams of flexible display modules provided by embodiments of the present disclosure, respectively.

FIGS. 5A to 5C are structural schematic diagrams of flexible display devices provided by embodiments of the present disclosure, respectively.

DETAILED DESCRIPTION

The specific implementing manners of a flexible display module and a display device provided by embodiments of the present disclosure will be described in detail in conjunction with the accompanying drawings.

The thickness and shape of each layer in the accompanying drawings do not reflect the true scale of the flexible display module, the purpose of which is merely illustrative of the contents of the present disclosure.

Figure 1:
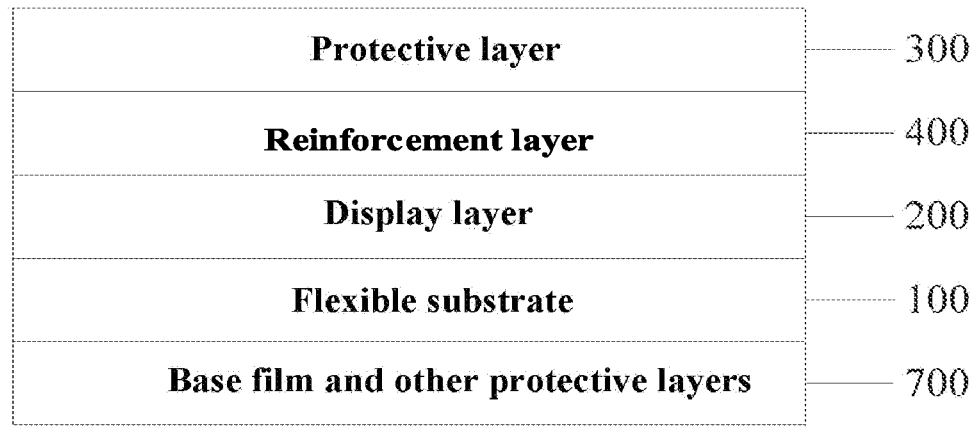
FIG. 1 is a structural schematic diagram of a flexible display module provided by embodiments of the present disclosure.

The embodiments of the present disclosure provide a flexible display module. As shown in FIG. 1, the flexible display module includes: a flexible substrate 100, a display layer 200 disposed on the flexible substrate 100, and a protective layer 300 disposed on the display layer 200. The flexible display module further includes a reinforcement layer 400 disposed between the display layer 200 and the protective layer 300, the modulus of the reinforcement layer 400 being greater than or equal to the modulus of any of the layers in the flexible display module.

In the flexible display module provided by the embodiment of the present disclosure, the reinforcement layer 400 is inserted between the display layer 200 and the protective layer 300, and the modulus of the reinforcement layer 400 is greater than or equal to that of any of the layers in the flexible display module, so that the strained neutral layer in the flexible display module is pulled to the vicinity of the reinforcement layer 400. Since the display layer 200 is closer to the reinforcement layer 400, it is less stressed, so that the bending characteristic of the display layer 200 can be enhanced. Thus, the reliability of the flexible display module in the ball drop test is improved while the thickness of the protective layer 300 does not affect the bending characteristics.

In specific implementation, in the above flexible display module provided by the embodiments of the present disclosure, the material of the protective layer 300 may be a plastic substrate or a glass substrate, which is not limited herein. The thickness of the protective layer can be between 5 μm and 300 μm.

In specific implementation, the protective layer 300 is a hard coating layer. For example, the hard coating layer is formed of material containing a silicon compound. The hard coating layer can increase surface hardness of the protective layer 300, so as to prevent scratch and friction damage.

In specific implementation, the above hard coating layer includes adhesive and a silicon compound mixed in the adhesive. The hard coating layer is formed by hardening a mixture containing a silicon compound, a photoinitiator, a solvent and a photoreactive compound under ultraviolet irradiation.

In specific implementation, the protective layer 300 further includes a plastic substrate, and the hard coating layer formed on a surface of the plastic substrate.

In specific implementation, the plastic substrate includes one or more selected from materials of polyimide (PI), polyethylene naphthalate (PEN), polyethylene terephthalate (PET), polyphenylene sulfide (PPS), polyallylate, and polycarbonate (PC). For example, the plastic substrate is PET, on the surface of which the hard coating layer is formed.

Figure 2A:
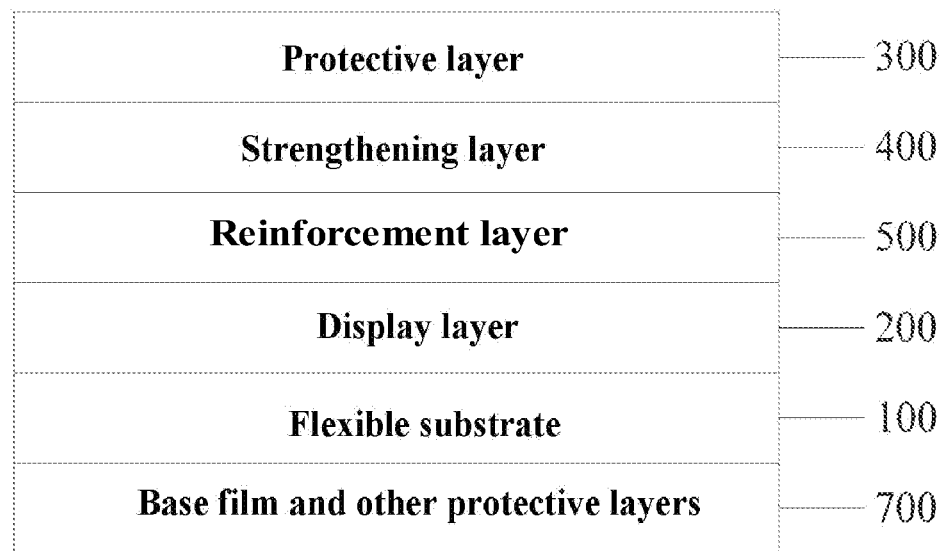
FIGS. 2A and 2B are another structural schematic diagrams of flexible display modules provided by embodiments of the present disclosure, respectively.
Figure 2B:
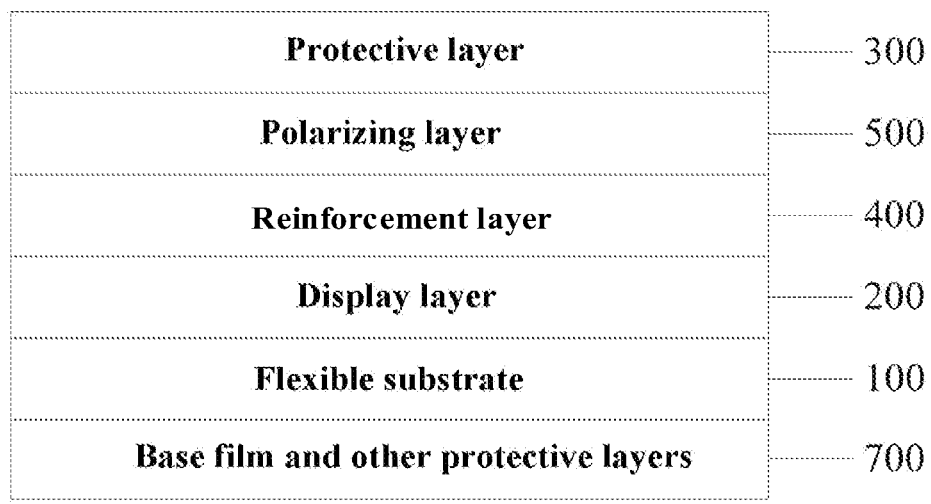

In specific implementation, as shown in FIGS. 2A and 2B, the above flexible display module provided by the embodiments of the present disclosure also includes a polarizing layer 500 disposed between the display layer 200 and the protective layer 300. Generally, a circular polarizing layer is used. In specific implementation, as shown in FIG. 2A, the reinforcement layer 400 may be disposed between the protective layer 300 and the polarizing layer 500. Preferably, as shown in FIG. 2B, the reinforcement layer 400 may also be disposed between the display layer 200 and the polarizing layer 500, that is, the reinforcement layer 400 is adjacent to the display layer 200. Such a structure can reduce the stress imposed on the display layer 200 when it is bent, which helps to prevent the display layer 200 from being damaged during the bending.

Figure 3A:
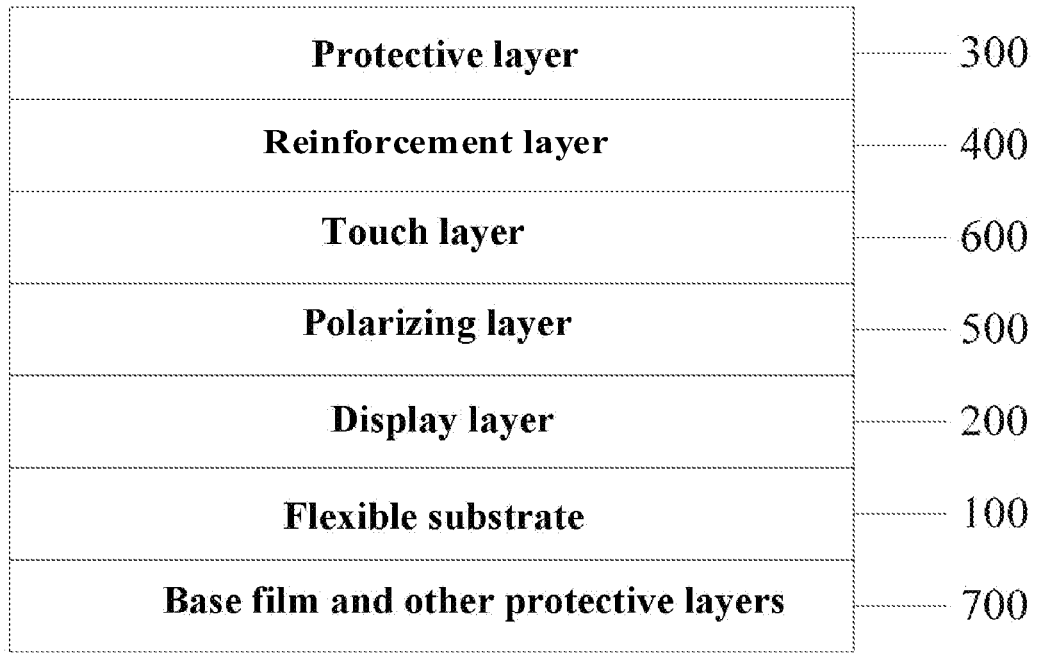
Figure 3B:
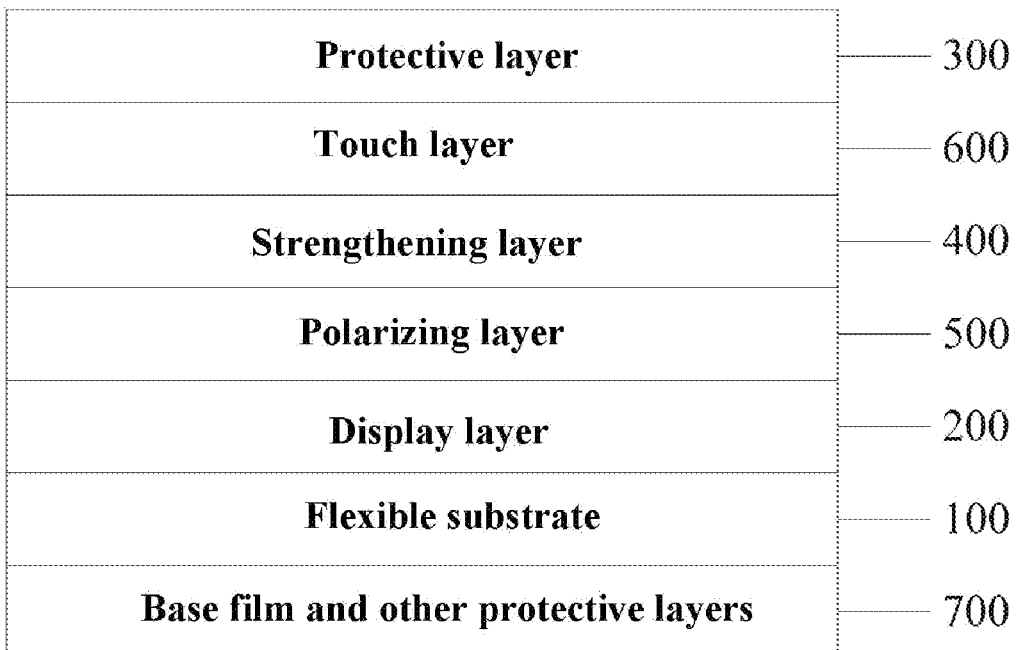

In specific implementation, the above flexible display module provided by the embodiments of the present disclosure further includes a touch layer 600. As shown in FIGS. 3A to 3C, the touch layer 600 can be disposed between the polarizing layer 500 and the protective layer 300. Alternatively, as shown in FIGS. 3D to 3F, the touch layer 600 can be disposed between the polarizing layer 500 and the display layer 200.

Specially, when the touch layer 600 is disposed between the polarizing layer 500 and the protective layer 300, the reinforcement layer 400 may be disposed between the protective layer 300 and the touch layer 600 as shown in FIG. 3A, or the reinforcement layer 400 may be disposed between the touch layer 600 and the polarizing layer 500 as shown in FIG. 3B. In one embodiment, as shown in FIG. 3C, the reinforcement layer 400 may also be disposed between the polarizing layer 500 and the display layer 200, that is, the reinforcement layer 400 is adjacent to the display layer 200. Such a structure can reduce the stress imposed on the display layer 200 when it is bent, which helps to prevent the display layer 200 from being damaged during the bending.

Figure 3E:
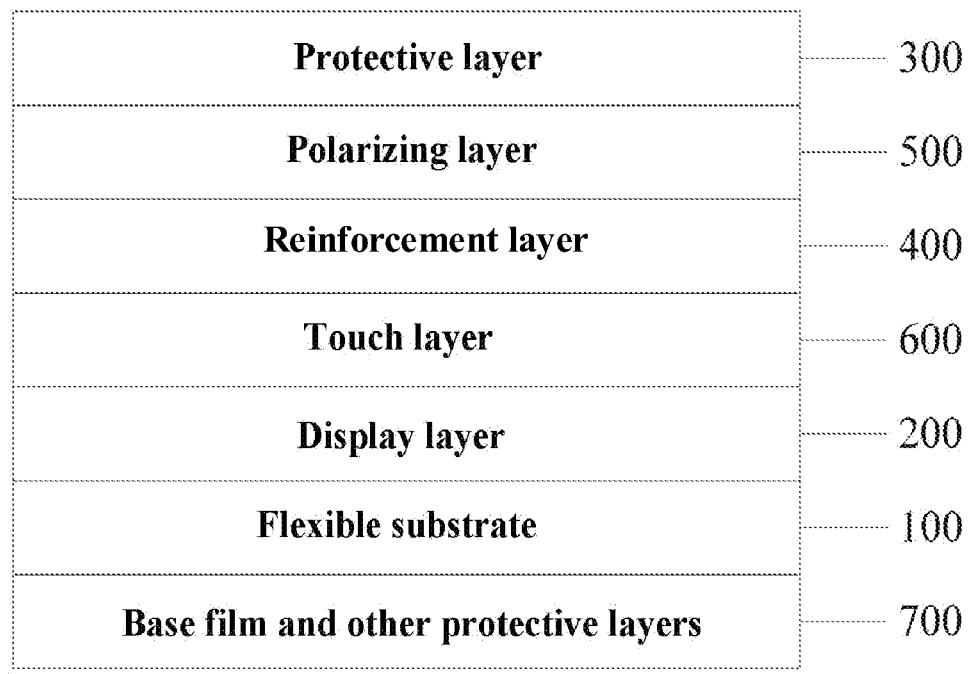
Figure 3F:
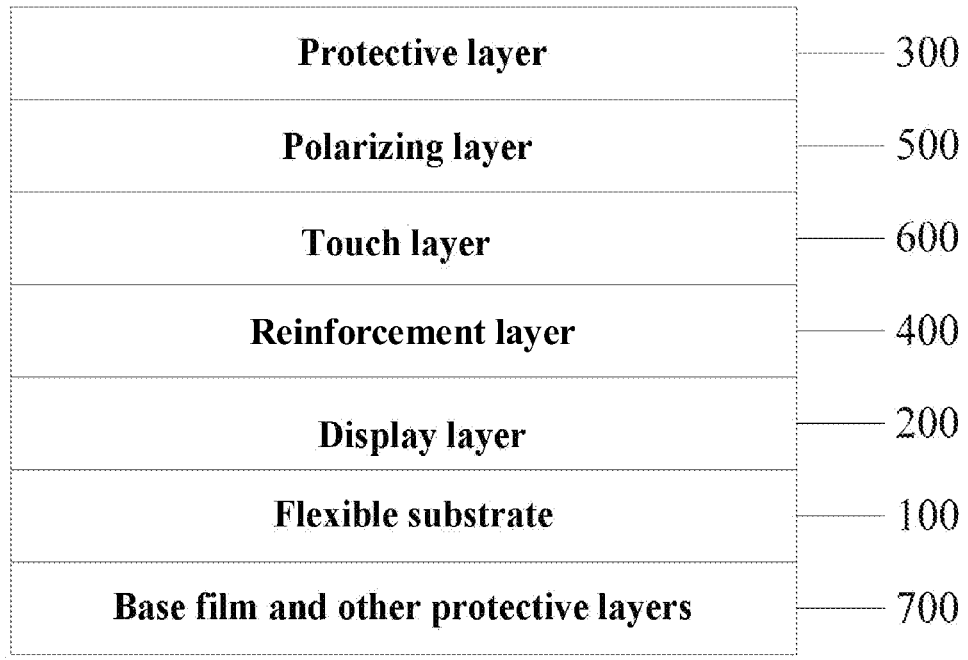

Specifically, when the touch layer 600 is disposed between the polarizing layer 500 and the display layer 200, the reinforcement layer 400 may be disposed between the protective layer 300 and the polarizing layer 500 as shown in FIG. 3D, or the reinforcement layer 400 may be disposed between the polarizing layer 500 and the touch layer 600 as shown in FIG. 3E. In one embodiment, as shown in FIG. 3F, the reinforcement layer 400 may also be disposed between the touch layer 600 and the display layer 200, that is, the reinforcement layer 400 is adjacent to the display layer 200 and the reinforcement layer 400 is also adjacent to the touch layer 600. Such a structure can reduce the stress imposed on the display layer 200 and the touch layer 600 when they are bent, which helps to prevent the display layer 200 and the touch layer 600 from being damaged during the bending.

In addition, as shown in FIG. 1, the above flexible display module provided by the embodiment of the present disclosure also includes a base film and other protective layers 700 provided on the back surface of the flexible substrate 100, which is not limited herein.

In specific implementation, in the above flexible display module provided by the embodiment of the present disclosure, the thickness of the reinforcement layer 400 ranges from 10 μm to 150 μm.

In one embodiment, in the above flexible display module provided in the embodiment of the present disclosure, the thickness of the reinforcement layer 400 ranges from 30 μm to 120 μm.

In one embodiment, in the above flexible display module provided in the embodiment of the present disclosure, the thickness of the reinforcement layer 400 ranges from 30 μm to 100 μm.

In specific implementation, in the above flexible display module provided by the embodiment of the present disclosure, it is required that the modulus of the reinforcement layer 400 ranges from 10 Gpa to 200 Gpa to be higher than that of other layers in the flexible display module.

In specific implementation, in the above flexible display module provided by the embodiment of the present disclosure, the material of the reinforcement layer 400 includes glass, the glass may be a high modulus material such as soft glass or inorganic fiber-reinforced organic material. Here, the soft glass, i.e. flexible glass, refers to a glass, the thickness of which usually reaches a order of 100 μm or is less than 100 μm, such that such glass becomes flexible and bendable. Material of the soft glass can be, for example, aluminosilicate, lithium aluminosilicate, etc. The soft glass can be, for example, aluminosilicate glass, lithium aluminosilicate glass, alkali metal borosilicate glass, sodium calcium glass or alkali free aluminosilicate glass. Other materials with high modulus may also be used, which is not limited herein. In addition, the reinforcement layer 400 needs to be able to withstand bending of 100,000 times or more with a radius of 1 mm-15 mm.

In specific implementation, the reinforcement layer 400 is a single-layer structure formed of the glass. That is, the reinforcement layer 400 is a layer of the glass.

In specific implementation, a thickness of the glass ranges from 10 μm to 50 μm, such glass is often called soft glass or ultra-thin glass (UTG).

In specific implementation, the thickness of the glass ranges from 10 μm to 35 μm, such glass is often called UTG.

In specific implementation, the reinforcement layer 400 is a laminated layer of the glass and an organic material layer, that is, the glass and an organic material layer are laminated to form the reinforcement layer 400, and the organic material layer is disposed above or below the glass, or both above and below the glass.

In specific implementation, the reinforcement layer 400 is a laminated layer of the glass and PET.

In specific implementation, the reinforcement layer 400 is a laminated layer of the glass and PI.

In specific implementation, an upper surface or a lower surface of the reinforcement layer 400 is provided with an adhesive layer.

In specific implementation, the adhesive layer is optical clear adhesive (OCA).

In specific implementation, in the above flexible display module provided by the embodiment of the present disclosure, the transmittance of the reinforcement layer 400 is greater than 90%, so that the added reinforcement layer 400 does not affect the normal display of the flexible display module.

In specific implementation, in the above flexible display module provided by the embodiment of the present disclosure, the reinforcement layer 400 may be fixed to an adjacent layer by a glue material. In addition, the other layers in the flexible display module provided in the embodiments of the present disclosure, that is, the protective layer 300, the display layer 200, the polarizing layer 500 and the touch layer 600, may be fixedly connected to each other by a glue material.

The structure shown in FIG. 3C is taken as Example 1, the structure shown in FIG. 3F is taken as Example 2, the structure which is similar as that shown in FIG. 3C but without the reinforcement layer 400 is taken as Comparative Example 1, and the structure which is similar as that shown in FIG. 3F but without the reinforcement layer 400 is taken as Comparative Example 2, respectively, the bending test and ball drop test are performed, and the results are shown in the following Table 1.

TABLE 1

|  | Bend 100,000 times with radius of 3 mm | Bend 100,000 times with radius of 5 mm | 0.1 J of ball drop impact energy | 0.2 J of ball drop impact energy |
| --- | --- | --- | --- | --- |
| Example 1 | OK | OK | OK | OK |
| Example 2 | OK | OK | OK | OK |
| Comparative Example 1 | OK | OK | NG | NG |
| Comparative Example 2 | OK | OK | NG | NG |

Wherein, the ball drop test method used is described as follows.

The flexible display module is placed with the display surface facing upwards and then firmly fixed in a specific area of the sample stage. During the test, in order to protect the flexible printed circuit (FPC) and the driving part from being damaged by the heavy ball, the edge of the FPC of the flexible display module and the driving IC end should be fixed outside the falling range of the heavy ball. A steel ball with mass of 32.65 g and diameter of 20 mm free falls from a certain height and arrives at different parts of the window area of the flexible display module. After each one point is tested, the appearance and mechanical functions of the flexible display module are checked, and electrical functions of the flexible display module are tested. The table of test height and corresponding energy is shown in the following Table 2.

TABLE 2

| Table of comparing test energy | |
| --- | --- |
| Diameter of steel ball (mm) | ø20 |
| Mass of steel ball (g) | 32.65 |
| Impact energy (J) | Corresponding height (cm) |
| 0.10 | 31.5 |
| 0.20 | 62.5 |

Figure 6A:
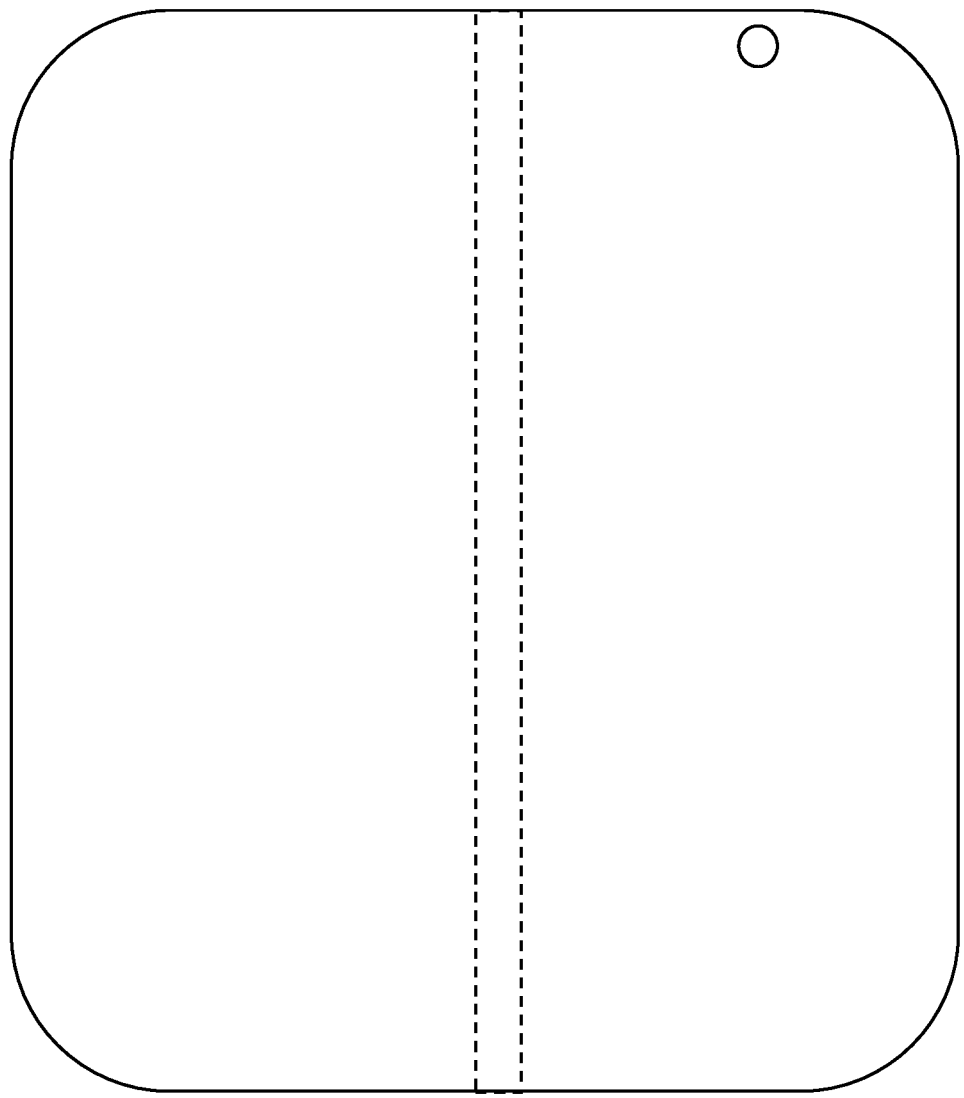
FIG. 6A is a schematic diagram of a foldable flexible display device provided by an embodiment of the present disclosure.
Figure 6B:
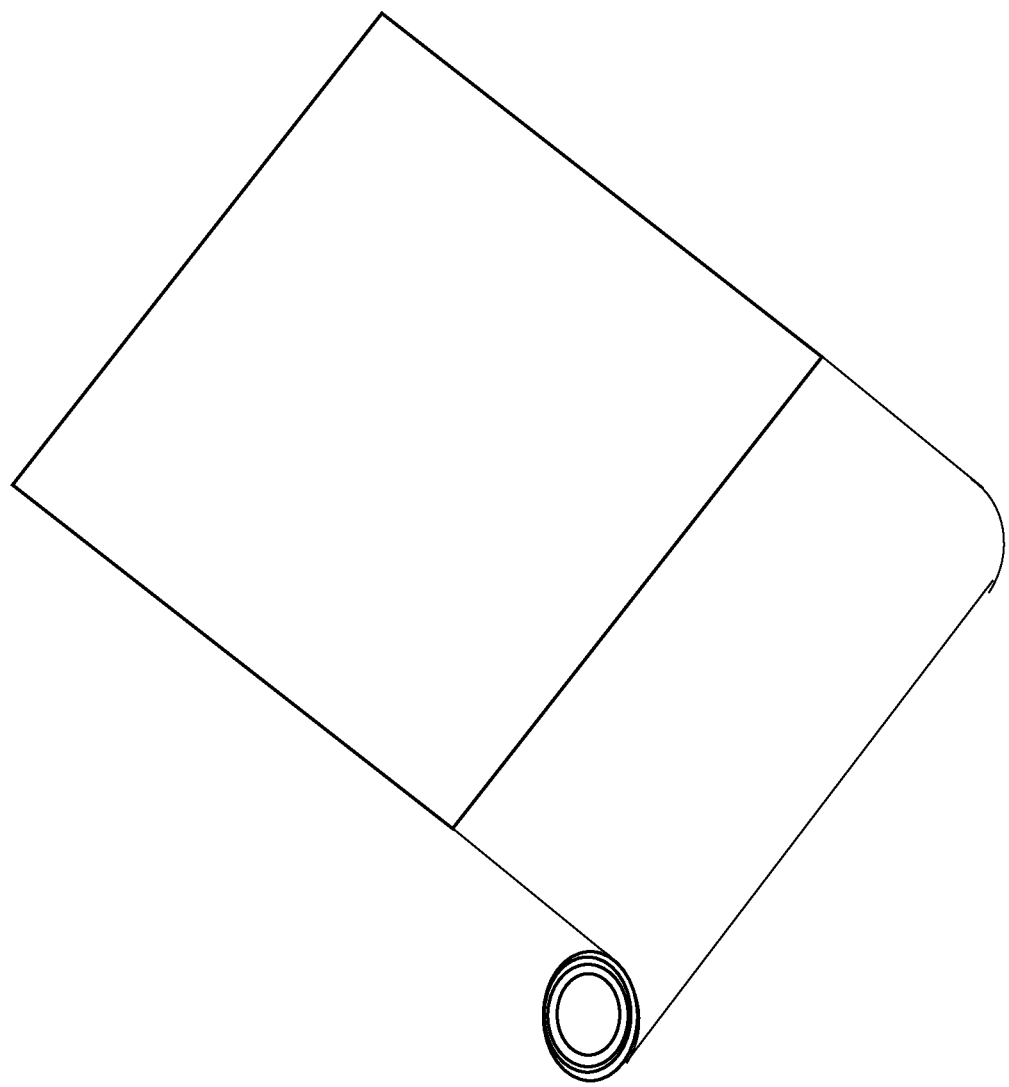
FIG. 6B is a schematic diagram of a rollable flexible display device provided by an embodiment of the present disclosure.
Figure 6C:
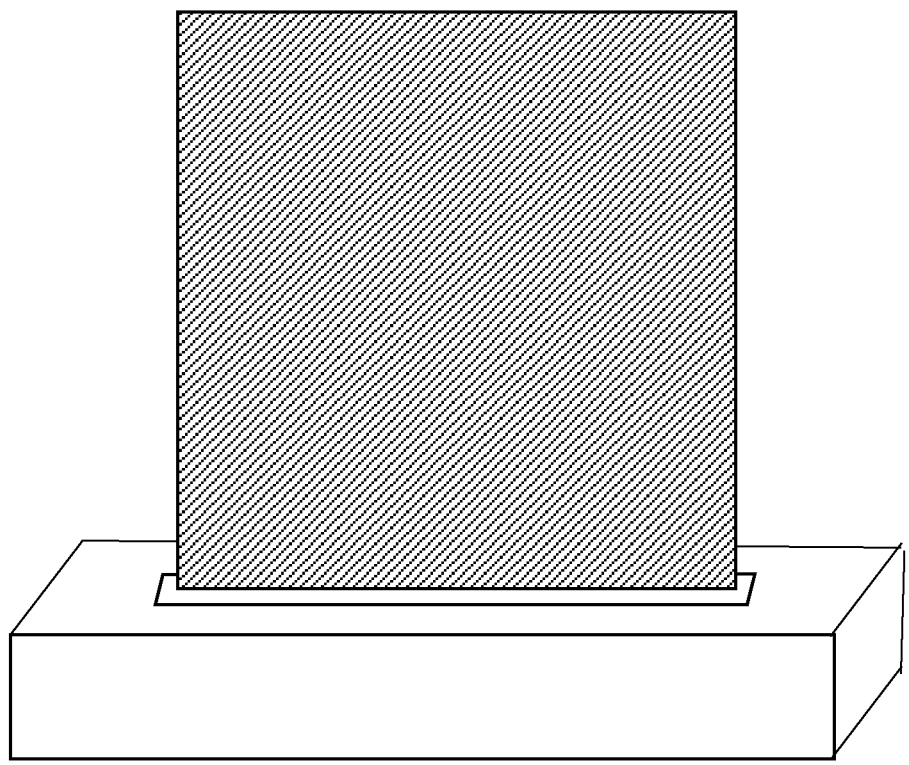
FIG. 6C is a schematic diagram of a slidable flexible display device provided by an embodiment of the present disclosure

In specific implementation, the flexible display device provided by the present disclosure is a foldable flexible display device, a rollable flexible display device, or a slidable flexible display device, as shown in FIGS. 6A, 6B and 6C. FIG. 6A is a schematic diagram of a foldable flexible display device provided by an embodiment of the present disclosure. FIG. 6B is a schematic diagram of a rollable flexible display device provided by an embodiment of the present disclosure. FIG. 6C is a schematic diagram of a slidable flexible display device provided by an embodiment of the present disclosure.

In specific implementation, the flexible display device of the present disclosure may include at least one or more of the above protective layer, reinforcement layer, polarizing layer, touch layer, display layer, flexible substrate, base film and other protective layers. In order to realize folding function, these films should be as thin and flexible as possible, and meet the bending mechanical properties of folding, crimping and sliding, and reliability test.

In specific implementation, the protective layer of the present disclosure can be a hard coating layer. For example, the hard coating layer is formed of a material containing a silicon compound. The hard coating layer can increase surface hardness of the protective layer, so as to prevent scratch and friction damage.

In specific implementation, the protective layer of the present disclosure may include a plastic substrate and the hard coating layer formed on the surface of the plastic substrate. For example, the protective layer may include a PET substrate and the hard coating layer formed on the surface of the PET substrate.

In specific implementation, the reinforcement layer of the present disclosure may include the above mentioned soft glass.

In specific implementation, the polarizing layer of the present disclosure is a circular polarizer layer, which mainly prevents the reflection of external light, so as to improve the display effect.

In specific implementation, the touch layer of the present disclosure is a separate layer additionally attached above the display layer. For example, it can be separately purchased from other manufacturer.

In specific implementation, the touch layer of the present disclosure is directly integrated in the display layer by a certain semiconductor process.

The touch layer is generally disposed on the external side of the packaging layer of the display layer.

In specific implementation, the flexible substrate of the present disclosure can be a plastic substrate, such as a PI substrate, or other flexible substrates such as a glass substrate.

In specific implementation, the base film and other protective layers of the present disclosure can be organic material such as PET or PI.

In specific implementation, the base film and other protective layers of the present disclosure may include a supporting layer, disposed below the flexible substrate, for supporting and protecting the layers above it, for example, the supporting layer may include a metal supporting layer, a carbon fiber composite supporting layer, or a glass fiber reinforced material supporting layer, and so on.

In specific implementation, the flexible display device provided by the present disclosure includes a flexible display module as shown in FIG. 1, including a protective layer 300, a reinforcement layer 400, a display layer 200, a flexible substrate 100 and a base film and other protective layers 700. The protective layer 300 may include a plastic substrate and a hard coating layer formed on the surface of the plastic substrate, such as a PET substrate and the hardened coating. The reinforcement layer 400 may include a glass, i.e., soft glass, or UTG with a thickness range of 10 μm-50 μm. The reinforcement layer 400 may be UTG with a thickness range of 15 μm-35 μm. The flexible substrate 100 may be a plastic substrate, such as a PI substrate, or other flexible substrate such as a glass substrate. The base film and other protective layers 700 may be an organic material such as PET or PI. In this embodiment, the display layer 200 integrates the touch function and polarizing function by adopting a certain semiconductor process, thus omitting the process of attaching the touch layer and polarizing layer on the external side of the display layer, such that the thickness of the flexible display device is reduced.

In specific implementation, the flexible display device provided by the present disclosure includes a flexible display module as shown in FIG. 2A, including a protective layer 300, a reinforcement layer 400, a polarizing layer 500, a display layer 200, a flexible substrate 100 and a base film and other protective layers 700. Similar to FIG. 1, the protective layer 300 may include a plastic substrate and a hard coating layer formed on the surface of the plastic substrate, such as a PET substrate and the hardened coating. The reinforcement layer 400 may include a glass, i.e., soft glass, or UTG with a thickness range of 10 μm-50 μm. The reinforcement layer 400 may be UTG with a thickness range of 15 μm-35 μm. The flexible substrate 100 may be a plastic substrate, such as a PI substrate, or other flexible substrate such as a glass substrate. The base film and other protective layers 700 may be an organic material such as PET or PI. In this embodiment, unlike in FIG. 1, the polarizing layer 500 of the present disclosure is a separate layer additionally attached on the surface of the display layer 200 distal to the flexible substrate 100. For example, the polarizing layer 500 can be separately purchased from other manufacturer. In this embodiment the display layer 200 need not integrate the polarizing function.

In specific implementation, the flexible display device provided by the present disclosure includes a flexible display module as shown in FIG. 3A, including a protective layer 300, a reinforcement layer 400, a touch layer 600, a polarizing layer 500, a display layer 200, a flexible substrate 100 and a base film and other protective layers 700. Similar to FIG. 1, the protective layer 300 may include a plastic substrate and a hard coating layer formed on the surface of the plastic substrate, such as a PET substrate and the hardened coating. The reinforcement layer 400 may include a glass, i.e., soft glass, or UTG with a thickness range of μm-50 μm. The reinforcement layer 400 may be UTG with a thickness range of 15 μm-μm. The flexible substrate 100 may be a plastic substrate, such as a PI substrate, or other flexible substrate such as a glass substrate. The base film and other protective layers 700 may be an organic material such as PET or PI. In this embodiment, unlike in FIG. 1 or FIG. 2A, both the touch layer 600 and the polarizing layer 500 of the present disclosure are separate layers additionally attached on the surface of the display layer 200 distal to the flexible substrate 100. For example, the touch layer 600 and the polarizing layer 500 can be separately purchased from other manufacturer. In this embodiment the display layer 200 need not integrate the touch function and polarizing function.

In specific implementation, the flexible display device provided by the present disclosure includes a flexible display module as shown in FIG. 3D, including a protective layer 300, a reinforcement layer 400, a polarizing layer 500, a touch layer 600, a display layer 200, a flexible substrate 100 and a base film and other protective layers 700. Similar to FIG. 1, the protective layer 300 may include a plastic substrate and a hard coating layer formed on the surface of the plastic substrate, such as a PET substrate and the hardened coating. The reinforcement layer 400 may include a glass, i.e., soft glass, or UTG with a thickness range of μm-50 μm. The reinforcement layer 400 may be UTG with a thickness range of 15 μm-μm. The flexible substrate 100 may be a plastic substrate, such as a PI substrate, or other flexible substrate such as a glass substrate. The base film and other protective layers 700 may be an organic material such as PET or PI. In this embodiment, like in FIG. 3A, both the touch layer 600 and the polarizing layer 500 of the present disclosure are separate layers additionally attached on the surface of the display layer 200 distal to the flexible substrate 100. For example, the touch layer 600 and the polarizing layer 500 can be separately purchased from other manufacturer. In this embodiment the display layer 200 need not integrate the touch function and polarizing function. The difference between FIG. 3A and FIG. 3D lies in that the polarizing layer 500 is disposed on the surface of the touch layer 600 distal to the flexible substrate 100 in FIG. 3D.

In the flexible display module and the display device provided by the embodiment of the present disclosure, a reinforcement layer is inserted between the display layer and the protective layer, and the modulus of the reinforcement layer is greater than or equal to that of any of the layers in the flexible display module, so that the strained neutral layer in the flexible display module is pulled to the vicinity of the reinforcement layer. Since the display layer is closer to the reinforcement layer, it is less stressed, so that the bending characteristic of the display layer can be enhanced. Thus, the reliability of the flexible display module in the ball drop test is improved while the thickness of the protective layer does not affect the bending characteristics.

Some embodiments of the present disclosure provide a flexible display panel. As shown in FIGS. 4A-4E, a flexible display panel includes a flexible substrate 1100, a display layer 1200 on the flexible substrate, a reinforcement layer 1400 on a side of the display layer 1200 distal to the flexible substrate; and a protective layer 1300 on a side of the reinforcement layer 1400 distal to the flexible substrate. The reinforcement layer is a multi-layer laminate structure including at least one colorless polyimide layer and the reinforcement layer is configured to enhance the reliability testing of the flexible display panel.

Figure 4A:
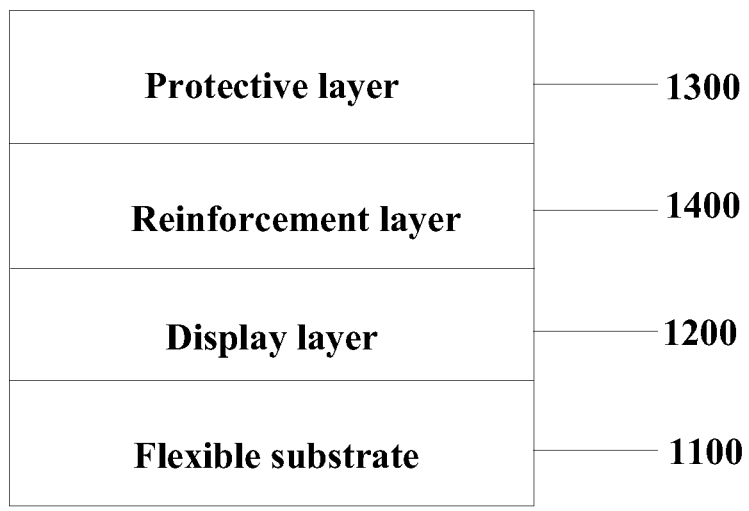
FIGS. 4A to 4E are structural schematic diagrams of flexible display panels provided by embodiments of the present disclosure, respectively.
Figure 4B:
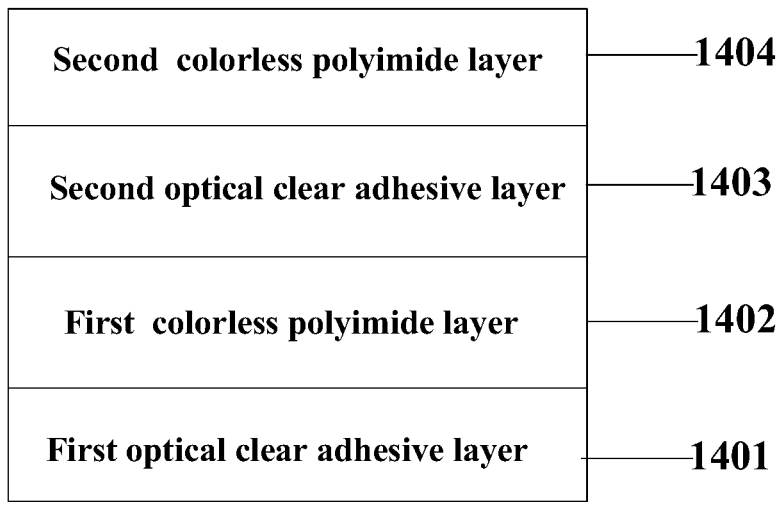
Figure 4C:
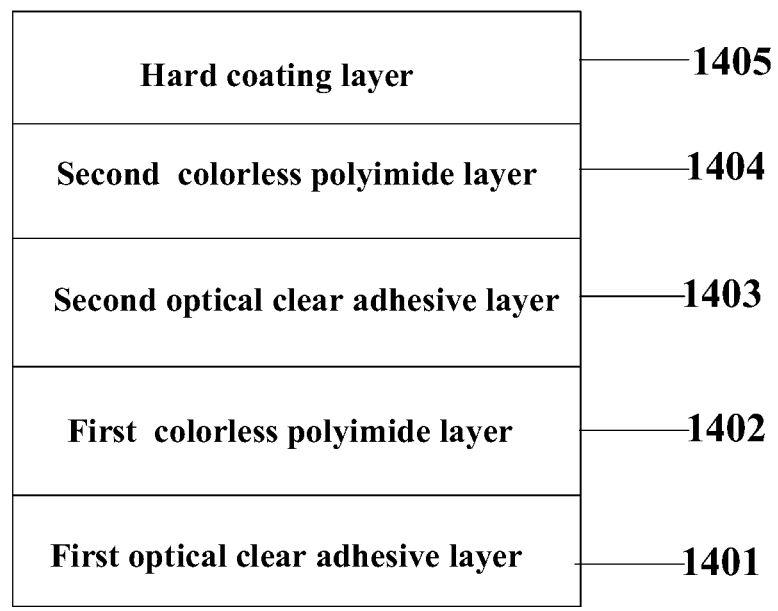

In one embodiment, as shown in FIGS. 4B and 4C, the reinforcement layer includes a first optical clear adhesive layer 1401, a first colorless polyimide layer on a side of the first optical clear adhesive layer distal to the flexible substrate 1402, a second optical clear adhesive layer 1403 on a side of the first colorless polyimide layer distal to the flexible substrate, and a second colorless polyimide layer 1404 on a side of the second optical clear adhesive layer distal to the flexible substrate.

The elastic modulus of the first colorless polyimide layer ranges from 3 Gpa to 10 Gpa. The elastic modulus of the second colorless polyimide layer ranges from 3 Gpa to 10 Gpa. The thickness of the first colorless polyimide layer is ranges from 35 μm to 100 μm. In an exemplary embodiment, the thickness of the first colorless polyimide layer is 80 μm. The thickness of the second colorless polyimide layer ranges from 35 μm to 100 μm. In an exemplary embodiment, the thickness of the second colorless polyimide layer is 80 μm.

As shown in FIG. 4C, the reinforcement layer further comprises a hard coating layer 1405 on a side of the second colorless polyimide layer 1404 distal to the flexible substrate. The material of the hard coating layer may be acrylic polymer. The thickness of the hard coating layer is 10 μm.

In the flexible display panel provided by the embodiment of the present disclosure, the reinforcement layer 1400 is inserted between the display layer 1200 and the protective layer 1300. The reinforcement layer 1400 is a multi-layer laminate structure including at least one colorless polyimide layer and the modulus of the reinforcement layer 1400 is greater than or equal to that of any of the layers in the flexible display panel, so that the strained neutral layer in the flexible display module is pulled to the vicinity of the reinforcement layer 1400. Since the display layer 200 is closer to the reinforcement layer 1400, it is less stressed, so that the bending characteristic of the display layer 1200 can be enhanced. Thus, the reliability of the flexible display panel in the ball drop test is improved.

Figure 4D:
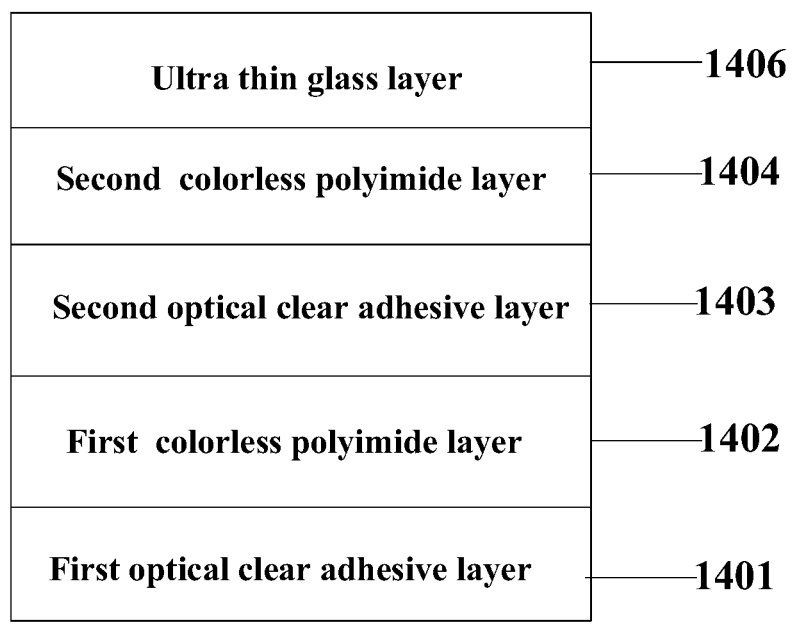

In one embodiment, as shown in FIG. 4D, the reinforcement layer comprises a first optical clear adhesive layer 1401, a colorless polyimide layer 1402 on a side of the first optical clear adhesive layer 1401 distal to the flexible substrate, a second optical clear adhesive layer 1403 on a side of the colorless polyimide layer 1402 distal to the flexible substrate, and an ultra-thin glass (UTG) layer 1406 on a side of the second optical clear adhesive layer distal to the flexible substrate. The ultra-thin glass layer 1406 includes the glass whose elastic modulus ranges from 60 Gpa to 100 Gpa. The thickness of the ultra-thin glass layer 1406 ranges from 50 μm to 100 μm.

Figure 4E:
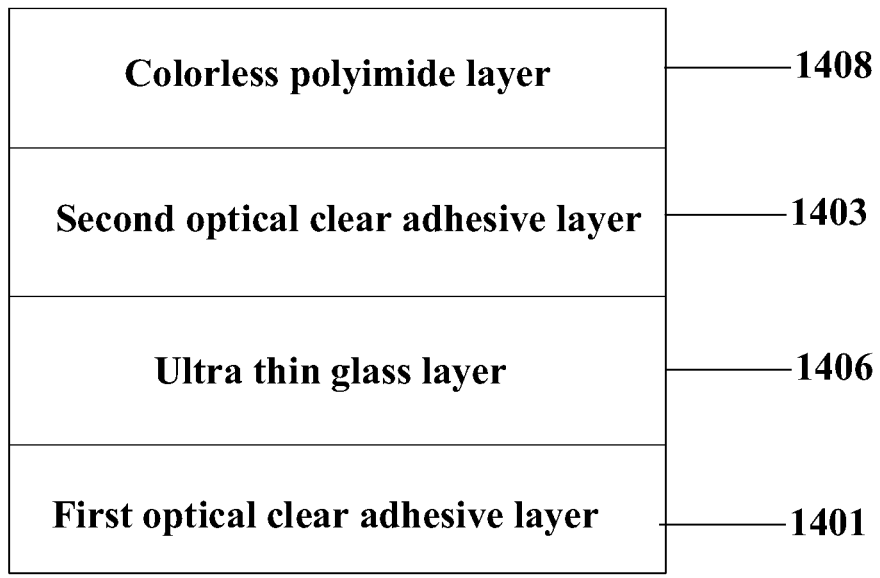

In one embodiment, as shown in FIG. 4E, the reinforcement layer includes a first optical clear adhesive layer 1401, an ultra-thin glass layer 1406 on a side of the first optical clear adhesive layer 1401 distal to the flexible substrate, a second optical clear adhesive layer 1403 on a side of the ultra-thin glass layer 1406 layer distal to the flexible substrate, and a colorless polyimide layer 1408 on a side of the second optical clear adhesive layer distal 1403 to the flexible substrate.

The reinforcement layer is a multi-layer laminate structure including at least one colorless polyimide layer. The reinforcement layer may include two one colorless polyimide layers to enhance the reliability testing of the flexible display panel. In another embodiment, the may include one colorless polyimide layers and one ultra-thin glass layer to enhance the reliability testing of the flexible display panel.

Figure 5A:
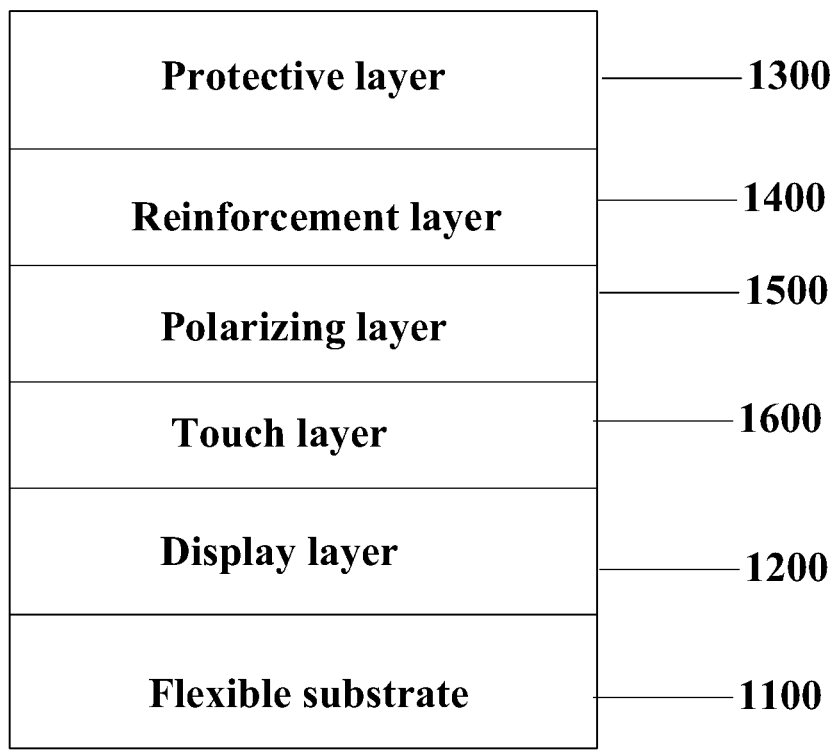
Figure 5B:
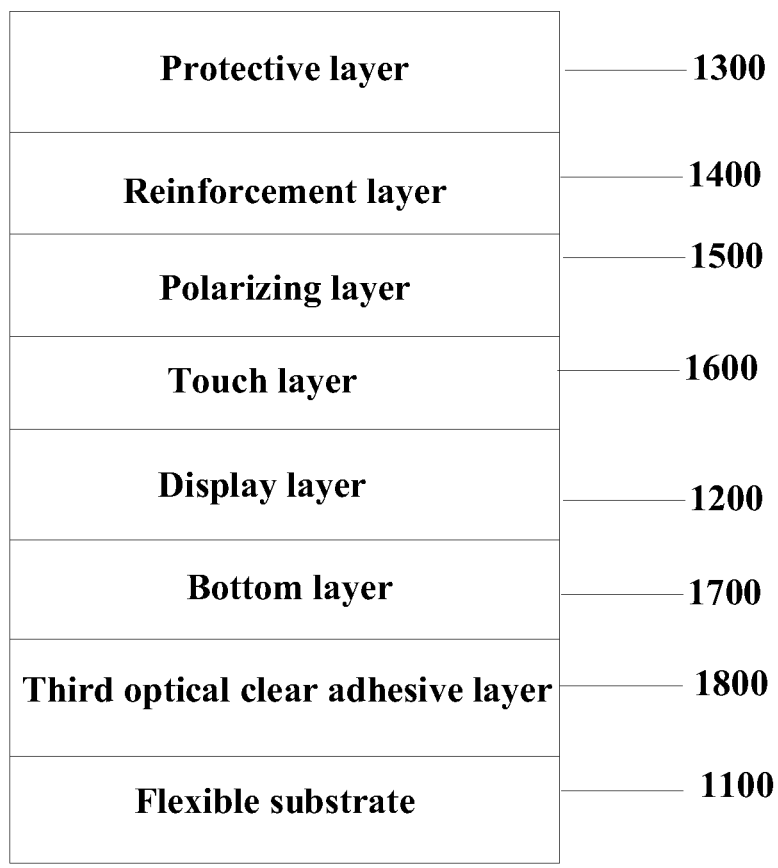

Some embodiments of the present disclosure provide a flexible display device. As shown in FIGS. 5A-5C, the flexible display device includes: a flexible substrate 1100; a display layer 1200 on the flexible substrate; a touch layer 1600 on a side of the display layer 1200 distal to the substrate; a polarizing layer on a side of the touch layer 1600 distal to the flexible substrate; a reinforcement layer 1400 on a side of the polarizing layer 1500 distal to the flexible substrate; a protective layer 1300 on a side of the reinforcement layer 1400 distal to the flexible substrate; wherein the reinforcement layer is a multi-layer laminate structure including at least one colorless polyimide layer and the reinforcement layer is configured to enhance the reliability testing of the flexible display device.

In one embodiment, the reinforcement layer comprises a first optical clear adhesive layer, a first colorless polyimide layer on a side of the first optical clear adhesive layer distal to the flexible substrate, a second optical clear adhesive layer on a side of the first colorless polyimide layer distal to the flexible substrate, and a second colorless polyimide layer on a side of the second optical clear adhesive layer distal to the flexible substrate. The reinforcement layer further includes a hard coating layer on a side of the second colorless polyimide layer distal to the flexible substrate.

In one embodiment, the reinforcement layer comprises a first optical clear adhesive layer, a colorless polyimide layer on a side of the first optical clear adhesive layer distal to the flexible substrate, a second optical clear adhesive layer on a side of the colorless polyimide layer distal to the flexible substrate, and an ultra-thin glass layer on a side of the second optical clear adhesive layer distal to the flexible substrate.

In one embodiment, the reinforcement layer comprises a first optical clear adhesive layer, an ultra-thin glass layer on a side of the first optical clear adhesive layer distal to the flexible substrate, a second optical clear adhesive layer on a side of the ultra-thin glass layer distal to the flexible substrate, and a colorless polyimide layer on a side of the second optical clear adhesive layer distal to the flexible substrate.

In one embodiment, as shown in FIG. 5B, the flexible display device further includes a bottom film layer 1700 on a side of the display layer proximal to the substrate and including an optical clear adhesive layer on a side of the bottom film layer proximal to the substrate.

In one embodiment, as shown in FIG. 5C, the bottom film layer comprises a pressure sensitive adhesive layer 1701 on a side of the display layer proximal to the substrate and a polyimide layer 1702 on a side of the pressure sensitive adhesive layer proximal to the substrate.

The elastic modulus of the first colorless polyimide layer ranges from 3 Gpa to Gpa. The elastic modulus of the second colorless polyimide layer ranges from 3 Gpa to 10 Gpa. The thickness of the first colorless polyimide layer is ranges from 35 μm to 100 μm. In an exemplary embodiment, the thickness of the first colorless polyimide layer is 80 μm. The thickness of the second colorless polyimide layer ranges from 35 μm to 100 μm. In an exemplary embodiment, the thickness of the second colorless polyimide layer is 80 μm. The ultra thin glass layer includes the glass whose elastic modulus ranges from 60 Gpa to 100 Gpa. The thickness of the ultra thin glass layer ranges from 50 μm to 100 μm.

The reinforcement layer is a multi-layer laminate structure including at least one colorless polyimide layer. The reinforcement layer is adjacent to the touch layer 600. Such a structure can reduce the stress imposed on the display layer 200 and the touch layer 600 when they are bent, which helps to prevent the display layer 200 and the touch layer 600 from being damaged during the bending. So that the reinforcement layer can enhance the reliability testing of the flexible display device.

It will be apparent to those skilled in the art that various changes and modifications can be made in the present disclosure without departing from the spirit and scope of the present disclosure. In this manner, it is intended that the present disclosure is also accompanied by such variations and modifications if the variations and modifications of the present disclosure are within the scope of the appended claims and the equivalents thereof.

What is claimed is:

1. A flexible display module, comprising:
   a flexible substrate;
   a display layer, disposed on the flexible substrate;
   a reinforcement layer, disposed on a side of the display layer distal to the flexible substrate;
   a protective layer, disposed on a side of the reinforcement layer distal to the flexible substrate;
   a polarizing layer, disposed between the display layer and the reinforcement layer;
   a touch layer, disposed between the polarizing layer and the display layer; and
   a base film, disposed on a back surface of the flexible substrate;
   wherein material of the reinforcement layer comprises glass and a thickness of the reinforcement layer ranges from 10 μm to 150 μm.

2. The flexible display module according to claim 1, wherein the thickness of the reinforcement layer ranges from 30 μm to 120 μm.

3. The flexible display module according to claim 1, wherein the thickness of the reinforcement layer ranges from 30 μm to 100 μm.

4. The flexible display module according to claim 1, wherein modulus of the reinforcement layer ranges from 10 Gpa to 200 Gpa.

5. The flexible display module according to claim 1, wherein material of the protective layer is a plastic substrate.

6. The flexible display module according to claim 1, wherein a thickness of the protective layer ranges from 5 μm to 300 μm.

7. The flexible display module according to claim 1, wherein the polarizing layer is a circular polarizing layer.

8. The flexible display module according to claim 1, wherein transmittance of the reinforcement layer is greater than 90%.

9. The flexible display module according to claim 1, wherein the reinforcement layer is a laminated layer of the glass and an organic material layer.

10. The flexible display module according to claim 9, wherein the organic material layer is disposed above or below the glass.

11. The flexible display module according to claim 10, wherein the organic material layer is polyethylene terephthalate, or polyimide.

12. A display device comprising a flexible display module, wherein the flexible display module comprises:
    a flexible substrate;
    a display layer, disposed on the flexible substrate;
    a reinforcement layer, disposed on a side of the display layer distal to the flexible substrate;
    a protective layer, disposed on a side of the reinforcement layer distal to the flexible substrate;
    a polarizing layer, disposed between the display layer and the reinforcement layer;
    a touch layer, disposed between the polarizing layer and the display layer; and
    a base film, disposed on a back surface of the flexible substrate;
    wherein material of the reinforcement layer comprises glass and a thickness of the reinforcement layer ranges from 10 μm to 150 μm.

13. The display device according to claim 12, wherein the thickness of the reinforcement layer ranges from 30 μm to 120 μm.

14. The display device according to claim 12, wherein the thickness of the reinforcement layer ranges from 30 μm to 100 μm.

15. The display device according to claim 12, wherein modulus of the reinforcement layer ranges from 10 Gpa to 200 Gpa.

16. The display device according to claim 12, wherein material of the protective layer is a plastic substrate.

17. The display device according to claim 12, wherein a thickness of the protective layer ranges from 5 μm to 300 μm.

18. The display device according to claim 12, wherein the polarizing layer is a circular polarizing layer.

19. The display device according to claim 12, wherein transmittance of the reinforcement layer is greater than 90%.

20. A display device comprising a flexible display module, wherein the flexible display module comprises:
a flexible substrate;
a display layer, disposed on the flexible substrate;
a reinforcement layer, disposed on a side of the display layer distal to the flexible substrate;
a protective layer, disposed on a side of the reinforcement layer distal to the flexible substrate; wherein material of the protective layer is a plastic substrate;
a polarizing layer, disposed between the display layer and the reinforcement layer;
a touch layer, disposed between the polarizing layer and the display layer; and
a base film, disposed on a back surface of the flexible substrate;
wherein material of the reinforcement layer comprises glass and a thickness of the reinforcement layer is 30 μm.

* * * * *